(12) United States Patent
Kushihara

(10) Patent No.: US 6,707,401 B2
(45) Date of Patent: Mar. 16, 2004

(54) CALCULATION PROCESSING DEVICE OF RESOLVER SIGNAL

(75) Inventor: Hiroshi Kushihara, Nagano-ken (JP)

(73) Assignee: Tamagawa Seiki Kabushiki Kaisha, Nagano-ken (JP)

( * ) Notice: Subject to any disclaimer, the term of this patent is extended or adjusted under 35 U.S.C. 154(b) by 0 days.

(21) Appl. No.: 10/151,013

(22) Filed: May 21, 2002

(65) Prior Publication Data

US 2002/0180625 A1 Dec. 5, 2002

(30) Foreign Application Priority Data

May 23, 2001 (JP) ........................................ 2001-154379

(51) Int. Cl.$^7$ .............................. H03M 1/48; H02P 5/34
(52) U.S. Cl. ........................................ 341/116; 318/801
(58) Field of Search ........................... 341/116; 318/801

(56) References Cited

U.S. PATENT DOCUMENTS 6,373,219 B1 * 4/2002 Obara et al. ................. 318/801
6,463,398 B2 * 10/2002 Sugiyama et al. .......... 702/145

* cited by examiner

*Primary Examiner*—Jean Jeanglaude
(74) *Attorney, Agent, or Firm*—Sughrue Mion, PLLC

(57) ABSTRACT

In a calculation processing device of a resolver signal, a processing speed of the resolver signal is increased, and a noise-proof characteristic thereof and also reliability thereof are improved, while total system cost is reduced. The resolver signal calculation processing device is arranged such that a resolver signal output from a resolver is digitally converted by a resolver interface into a digital rotary angle signal; the digitally-converted rotary angle signal is processed by a central calculation processing unit; and the resolver interface is provided within the resolver signal calculation processing device.

2 Claims, 2 Drawing Sheets

CALCULATION PROCESSING DEVICE OF RESOLVER SIGNAL

BACKGROUND OF THE INVENTION

1. Field of the Invention

The present invention generally relates to a calculation processing device of a resolver signal. More specifically, the present invention relates to such a resolver signal calculation processing device capable of detecting a rotary position with high precision and with employment of a simple arrangement.

2. Description of the Related Art

Conventionally, this sort of the resolver signal calculation processing device is known from, for instance, an arrangement made of an R/D (resolver/digital) converter and a peripheral appliance thereof as indicated in FIG. 2. While a resolver 1 is required so as to detect a rotary angle (rotation angle), hardware 2 such as a microcomputer or a DSP (digital signal processor) is needed in order that a resolver signal corresponding to an angular signal output from this resolver 1 may be utilized in a motor control operation and the like. In such a conventional resolver signal calculation processing device, the resolver 1, a resolver interface 1A such as the R/D converter, and the hardware 2 such as the microcomputer or the DSP are separately arranged.

It should be noted that as the resolver interface 1A, the following digital interface means for interfacing with the hardware 2 such as the microcomputer or the DSP may be employed, namely, a parallel I/O (input/output) interface, a parallel bus interface, a serial interface, an encoder-equivalent pulse interface, and the like.

Since the conventional resolver signal calculation processing device is arranged as described above, the below-mentioned problems occur. That is to say, since the resolver interface 1A is independently arranged with respect to the hardware 2, such a dedicated interface (not shown in the figure) used to connect the hardware 2 to the resolver interface 1A must be necessarily provided within this hardware 2 such as the microcomputer or the DSP. Therefore, since this dedicated interface is employed in the hardware 2, there are demerits as to the calculation processing speed and the noise-proof characteristics. Also, since a total number of components employed in this conventional device is increased, the reliability thereof is deteriorated. Furthermore, there are other problems in that the mounting space becomes bulky, and the manufacturing cost of the entire system is increased.

SUMMARY OF THE INVENTION

The present invention has been made to solve the above-explained problems, and therefore, has an object to provide a calculation processing device of a resolver signal, in which both an R/D converter corresponding to a resolver interface, and hardware such as a microcomputer or a DSP are arranged in an integral form, and thus, a processing speed, a noise-proof characteristic, and reliability can be improved while a manufacturing cost thereof is reduced.

To achieve the above-explained object, a calculation processing device of a resolver signal according to an aspect of the present invention is characterized in that a resolver signal output from a resolver is digitally converted by a resolver interface into a digital rotary angle signal; the digitally-converted rotary angle signal is processed by a central calculation processing unit; and the resolver interface is provided within the resolver signal calculation processing device. Also, in the resolver signal calculation processing device, the resolve interface is directly connected via an internal bus to the central calculation processing unit. Furthermore, the resolver interface is arranged by an R/D converter.

BRIEF DESCRIPTION OF THE DRAWINGS

For a better understanding of the present invention, reference is made of a detailed description in conjunction with the accompanying drawings, in which.

DETAILED DESCRIPTION OF THE PREFERRED EMBODIMENTS

Figure 1:
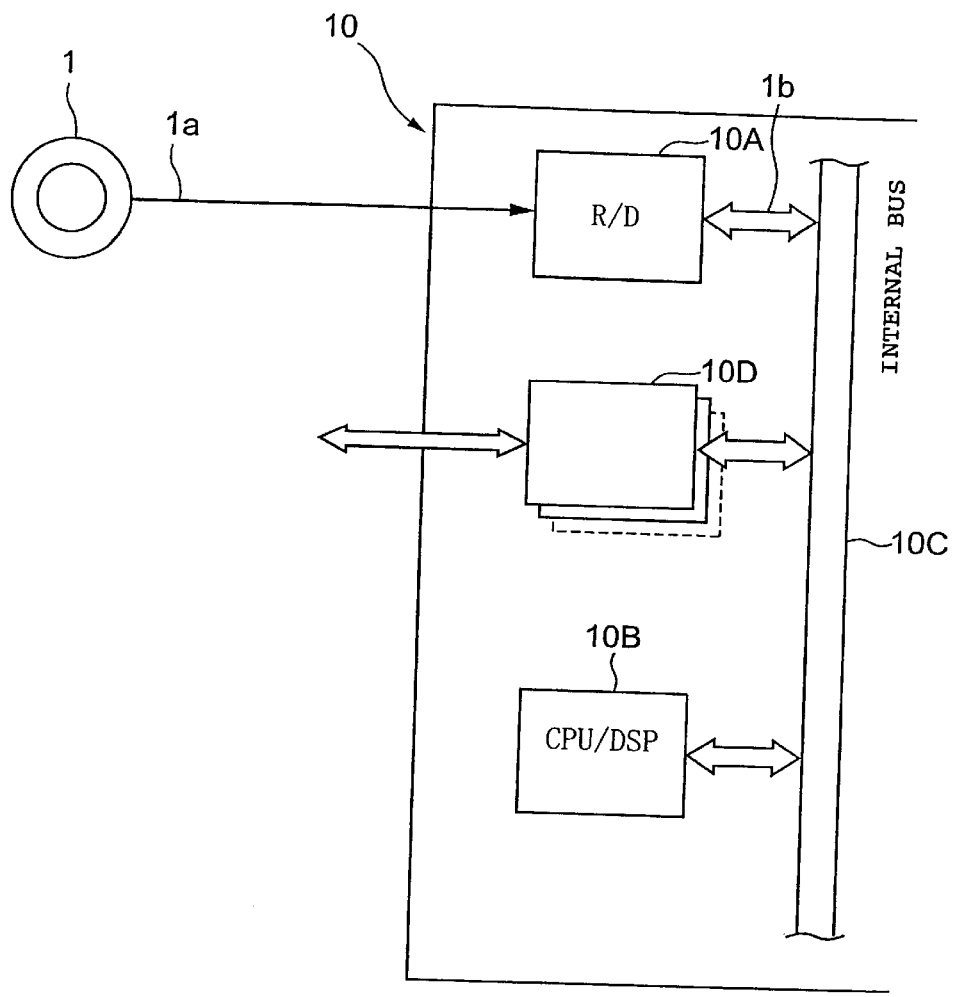
FIG. 1 is a schematic diagram for showing an arrangement of a calculation processing device of a resolver signal according to an embodiment of the present invention.

Referring now to drawings, a detailed description will be made of a calculation processing device of a resolver signal according to a preferred embodiment of the present invention.

It should be understood that the same reference numerals employed in the conventional resolver signal calculation processing device will be used as those for denoting the same or similar structural elements of the resolver signal calculation processing device according to the present invention, and therefore, explanations thereof are omitted.

As shown in FIG. 1, a calculation processing device 10 of a resolver signal according to an embodiment of the present invention is arranged such that both an R/D converter 10A and a central calculation processing unit 10B are connected via an internal bus 10C. This R/D converter 10A is connected to the resolver 1. The central calculation processing unit 10B is constructed of a core of either a CPU or DSP. Similar to the conventional resolver signal calculation processing device, another resolver (not shown) may be further connected to this resolver signal calculation processing device 10. As a result, this resolver signal calculation processing device 10 may be furthermore equipped with a conventional type interface 10D.

While such a resolver signal calculation processing device 10 of the present invention is employed, a resolver signal 1a output from the resolver 1 is digitally converted into a rotary angle (rotation angle) signal 1b by the resolver interface 10A equal to the R/D converter, and then, this rotary angle signal 1b is directly transferred via the internal bus 10C to the central calculation processing unit 10B.

Figure 2:
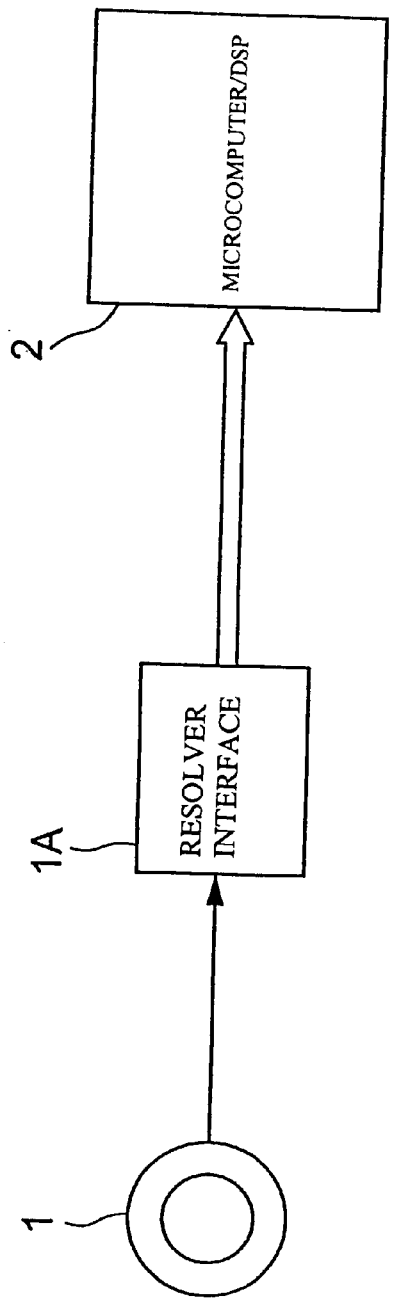
FIG. 2 is a schematic diagram for showing an arrangement of a conventional calculation processing device of the resolver signal.

As previously explained, since the resolver signal calculation processing device 10 of the present invention is equipped with the resolver interface 10A, this resolver interface 10A is connected via the internal bus 10C to the central operation processing unit 10B, so that this resolver interface 10A can be directly connected via the internal bus 10C to the central calculation processing unit 10B. It should be noted that as indicated in FIG. 2, the above-explained resolver interface 10A may be equivalent to a general-purpose interface (PIO, SIO, AD input etc.) contained in the conventional microcomputer/DSP. As a consequence, such a resolver signal calculation processing device can be provided, by which a rotary angle can be detected, while having superior noise-proof characteristics and also superior control performance with a high processing speed. In particular, the processing speed achieved by the resolver signal calculation processing device 10 may become approximately 1.5 to 2 times higher than the processing speed of the conventional resolver signal calculation processing device.

Also, in accordance with the resolver signal calculation processing device 10 of the present invention, since both the resolver interface 10A and the central calculation processing unit 10B are manufactured in the form of one chip or one package, a total number of components thereof can be reduced. As a result, an improvement of the reliability, miniaturization, a reduction of the mounting space, and also cost-cutting of the resolver signal calculation processing device 10 can be achieved.

Also, since the resolver signal calculation processing device 10 shown in FIG. 1, according to the present invention, may be equipped with the conventional type interface 10D, an R/D converter may be externally connected thereto similar to the prior art. Alternatively, while such a conventional type interface 10D is not provided, this resolver signal calculation processing device 10 may achieve the object of the present invention.

Generally speaking, in order to perform a motor control operation, the following three motor control methods can be conceived, namely, a motor control method using hardware such an R/D converter (as explained in the present invention), another motor control method of detecting a rotary angle by way of software with employment of a microcomputer or a DSP (see Japanese Patent Application Laid-open No. 11-118520), and a sensorless motor control method without using a sensor.

However, in such a case that a suppression of system cost may be considered as a top priority subject (for example, in case that the resolver signal calculation processing device is mounted on a vehicle), it is a best way to employ an R/D converter having a better dynamic characteristic for an efficiency of a motor. The reason why an acceleration characteristic is very important is given as follows, generally speaking, which does not appear as an apparent specification: That is, this acceleration characteristic may be caused by a mechanical external disturbance load and also an error characteristic of a resolver, which are used in an actual field. In this aspect, it may be concluded that the motor control method using the R/D converter constitutes the most proper motor control method among the above-explained three motor control methods.

The resolver signal calculation processing device according to the present invention is featured as follows: In the resolver signal calculation processing device in which the resolver signal output from the resolver is digitally converted by the resolver interface, and this digitally converted rotary angle signal is processed by the central calculation processing unit, since the resolver interface is provided within the resolver signal calculation processing device, it is possible to provide such a resolver signal calculation processing device capable of achieving the high calculation processing speed and the superior noise-proof characteristic, and also capable of improving the reliability and reducing the cost of the entire system. Also, since the resolver interface is directly connected via the internal bus to the central calculation processing unit, such a resolver signal calculation processing device having the high calculation processing speed and the superior noise-proof characteristic can be provided. In addition, since the resolver interface corresponds to the R/D converter, the total number of components can be reduced, so that the reliability of the resolver signal calculation processing device can be improved, while the manufacturing cost thereof can be reduced.

What is claimed is:

1. A single-chip calculation processing device for a resolver signal, comprising:

a resolver interface circuit formed on a chip and adapted to be coupled to a resolver and operative to convert a resolver signal output from the resolver into a digital rotary angle signal;

a central calculation processing unit formed on said chip and operative to process said digitally-converted rotary angle signal; and an internal bus on said chip;

wherein said resolver interface is directly connected via said internal bus to said central calculation processing unit.

2. A resolver signal calculation processing device as claimed in claim 1 wherein said resolver interface is an R/D (resolver/digital) converter.

* * * * *